US010692905B2

(12) United States Patent
Lin et al.

(10) Patent No.: US 10,692,905 B2
(45) Date of Patent: Jun. 23, 2020

(54) OPTICAL COMPONENT, OPTICAL ASSEMBLY AND OPTICAL MODULE

(71) Applicant: AZUREWAVE TECHNOLOGIES, INC., New Taipei (TW)

(72) Inventors: Kung-An Lin, New Taipei (TW); Chung-Che Yang, New Taipei (TW); Ming-Chun Lu, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 16/124,249

(22) Filed: Sep. 7, 2018

(65) Prior Publication Data

US 2019/0378866 A1 Dec. 12, 2019

(30) Foreign Application Priority Data

Jun. 11, 2018 (TW) .............................. 107120036 A

(51) Int. Cl.
*H01L 27/146* (2006.01)
*H01S 5/022* (2006.01)
(Continued)

(52) U.S. Cl.
CPC .. *H01L 27/14618* (2013.01); *H01L 27/14625* (2013.01); *H01L 27/14636* (2013.01); *H01L 31/02002* (2013.01); *H01L 31/0203* (2013.01); *H01L 31/02327* (2013.01); *H01L 33/483* (2013.01); *H01L 33/58* (2013.01); *H01L 33/62* (2013.01); *H01S 5/0228* (2013.01);
(Continued)

(58) Field of Classification Search
CPC ........... H01L 27/14618; H01L 31/0203; H01L 33/483; H01L 31/02327; H01L 33/58; H01L 31/02002; H01L 33/62; H01L 27/14625; H01L 27/14636; H01S 5/0228; H01S 5/02208; H01S 5/02288; H01S 5/183
See application file for complete search history.

(56) References Cited

U.S. PATENT DOCUMENTS

| | | | |
|---|---|---|---|
| 9,349,903 B2 * | 5/2016 | Hsu ........................ | H01L 31/12 |
| 2011/0051390 A1 * | 3/2011 | Lin .................... | H01L 27/14618 |
| | | | 361/818 |

(Continued)

FOREIGN PATENT DOCUMENTS

| CN | 102375292 A | 3/2012 |
|---|---|---|
| CN | 108598849 A | 9/2018 |

(Continued)

*Primary Examiner* — Yasser A Abdelaziez
(74) *Attorney, Agent, or Firm* — Li & Cai Intellectual Property (USA) Office

(57) ABSTRACT

An optical module includes an electronic assembly and an optical component. The electronic assembly includes a chip component and a circuit board. The optical assembly disposed on the electronic assembly includes a bracket and an optical component. The bracket surrounds the chip component and has at least two conductive layers separated from each other. The conductive layers extend to the bottom of the bracket and are electrically connected to the electronic assembly. The optical assembly is disposed on the bracket and has at least one light-transmissive conductive layer which is electrically connected to the conductive layers.

4 Claims, 10 Drawing Sheets

(51) Int. Cl.
  *H01S 5/183*   (2006.01)
  *H01L 33/48*   (2010.01)
  *H01L 33/58*   (2010.01)
  *H01L 33/62*   (2010.01)
  *H01L 31/0203*  (2014.01)
  *H01L 31/0232*  (2014.01)
  *H01L 31/02*   (2006.01)

(52) U.S. Cl.
  CPC ...... *H01S 5/02208* (2013.01); *H01S 5/02288* (2013.01); *H01S 5/183* (2013.01)

(56) References Cited

U.S. PATENT DOCUMENTS

| | | | |
|---|---|---|---|
| 2014/0043519 A1* | 2/2014 | Azuma | G03B 3/10 |
| | | | 348/345 |
| 2014/0184881 A1* | 7/2014 | McKinley | H04N 5/2253 |
| | | | 348/345 |
| 2015/0085262 A1 | 3/2015 | Ogura | |
| 2017/0213940 A1* | 7/2017 | Sakai | H01L 33/62 |

FOREIGN PATENT DOCUMENTS

| | | |
|---|---|---|
| JP | 2000331577 A | 11/2000 |
| JP | 201560159 A | 3/2015 |
| JP | 2019124794 A | 7/2019 |
| TW | M570522 U | 11/2018 |
| WO | 2017092694 A1 | 6/2017 |

\* cited by examiner

OPTICAL COMPONENT, OPTICAL ASSEMBLY AND OPTICAL MODULE

CROSS-REFERENCE TO RELATED PATENT APPLICATION

This application claims the benefit of priority to Taiwan Patent Application No. 107120036, filed on Jun. 11, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical component, and more particularly to an optical component, an optical assembly having the optical component, and an optical module having the optical component.

BACKGROUND OF THE DISCLOSURE

Referring to FIG. 1, a conventional optical module 9 includes a circuit board 91, a chip 92, a bracket 93, and an optical component 94. The chip 92 is disposed on the circuit board 91. The bracket 93 is disposed on the circuit board 91 and surrounds the chip 92. The optical component 94 is disposed on the bracket 93. The chip 92 can be selected from a light-emitting chip or a light-sensing chip. When the light-emitting chip is adopted as the chip 92, a lens with concentration, homogenization, or filtering effect is selected as the optical component 94 according to practical requirement. When the light-sensing chip is adopted as the chip 92, the light collection effect or the light guiding path need be considered so that a prism, a condenser lens, or the like is selected as the optical component 94. The kind of the optical component 94 selected seriously influences the performance of the optical module 9.

The conventional optical module 9 has been used in various fields, such as a lighting module of a portable electronic device, a light source of an indicator light, or a light sensing module for a fingerprint identifier. In conventional operation, the optical module 9 is inevitably shaken or collided with, causing the optical component 94 to gradually loosen or even slip out of the bracket 93. However, the conventional optical module 9 does not have any design for detecting whether the optical component 94 has detached or not, hence necessitating improvement in the relevant art.

SUMMARY OF THE DISCLOSURE

In response to the above-referenced technical inadequacies, the present disclosure provides an optical component, an optical assembly, and an optical module.

In one aspect, the present disclosure provides an optical component adapted to be mounted on a circuit board with an optical module. The optical component includes at least one light-transmissive conductive layer. The at least one light-transmissive conductive layer is electrically connected to the circuit board.

In certain embodiments, the optical component further includes an optical component body. The at least one light-transmissive conductive layer is disposed at one of the upper surface and the lower surface of the optical component body, and the at least one light-transmissive conductive layer includes two conductive ends disposed at two sides of the optical component body, respectively.

In certain embodiments, the optical component further includes an optical component body on which the at least one light-transmissive conductive layer is disposed. The shape of the optical component body is rectangular, and the at least one light-transmissive conductive layer extends from one corner of the optical component body to another opposite corner thereof. The at least one light-transmissive conductive layer is S-shaped or strip-shaped.

In one aspect, the present disclosure provides an optical assembly including a bracket, and an optical component. The bracket includes at least two conductive layers which extend to the bottom of the bracket, and the conductive layers are separated from each other. The optical component is disposed on the bracket, and the optical component includes at least one light-transmissive conductive layer which is electrically connected to the conductive layers.

In certain embodiments, the optical component further includes an optical component body. The at least one light-transmissive conductive layer is disposed on one of the upper surface and the lower surface of the optical component body, and the at least one light-transmissive conductive layer includes two conductive ends disposed at two sides of the optical component body, respectively. The at least one light-transmissive conductive layer is electrically disconnected the conductive layers when the optical component is detached from the bracket.

In certain embodiments, the bracket includes at least two grooves, and each of the conductive layers is respectively disposed in each of the grooves. The optical component further includes an optical component body on which the at least one light-transmissive conductive layer is disposed. The shape of the optical component body is rectangular, and the at least one light-transmissive conductive layer extends from one corner of the optical component body to another opposite corner thereof. The at least one light-transmissive conductive layer is S-shaped or strip-shaped.

In one aspect, the present disclosure provides an optical module, including an electronic assembly and an optical assembly. The electronic assembly includes a chip component and a circuit board. The optical assembly is disposed on the electronic assembly, and includes a bracket and an optical component. The bracket surrounds the chip component and includes at least two conductive layers separated from each other. The conductive layers extend to the bottom of the bracket and are electrically connected to the electronic assembly. The optical assembly is disposed on the bracket and includes at least one light-transmissive conductive layer which is electrically connected to the conductive layers.

In certain embodiments, the optical component further includes an optical component body. The at least one light-transmissive conductive layer is disposed on one of the upper surface and the lower surface of the optical component body, and the at least one light-transmissive conductive layer includes two conductive ends disposed at two sides of the optical component body, respectively. The conductive layers are configured on one of the outer surface, the inner surface, and the interior of the bracket. The at least one light-transmissive conductive layer is electrically disconnected from the conductive layers when the optical component is detached from the bracket.

In certain embodiments, the bracket further includes at least two grooves, and each of the conductive layers is respectively disposed in each of the grooves. The optical component further includes an optical component body on which the at least one light-transmissive conductive layer is disposed. The shape of the optical component body is rectangular, and the at least one light-transmissive conductive layer extends from one corner of the optical component body to another opposite corner thereof. The at least one light-transmissive conductive layer is S-shaped or strip-shaped.

In certain embodiments, the width of the conductive layers is longer than the width of the light-transmissive conductive layer.

Therefore, through detecting whether the light-transmissive conductive layer is electrically conducted to the conductive layers, the circuit of the electronic assembly can detect whether the optical component is detached, and can perform corresponding protection measures.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
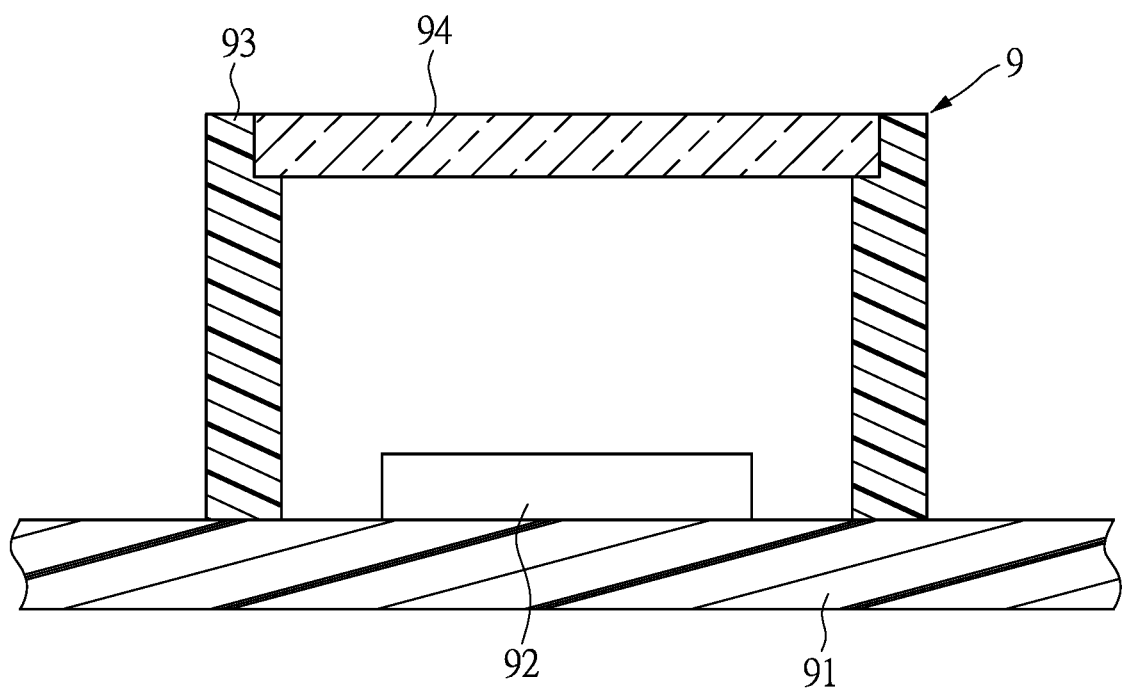
FIG. 1 is a cross-sectional view illustrating a conventional optical module.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
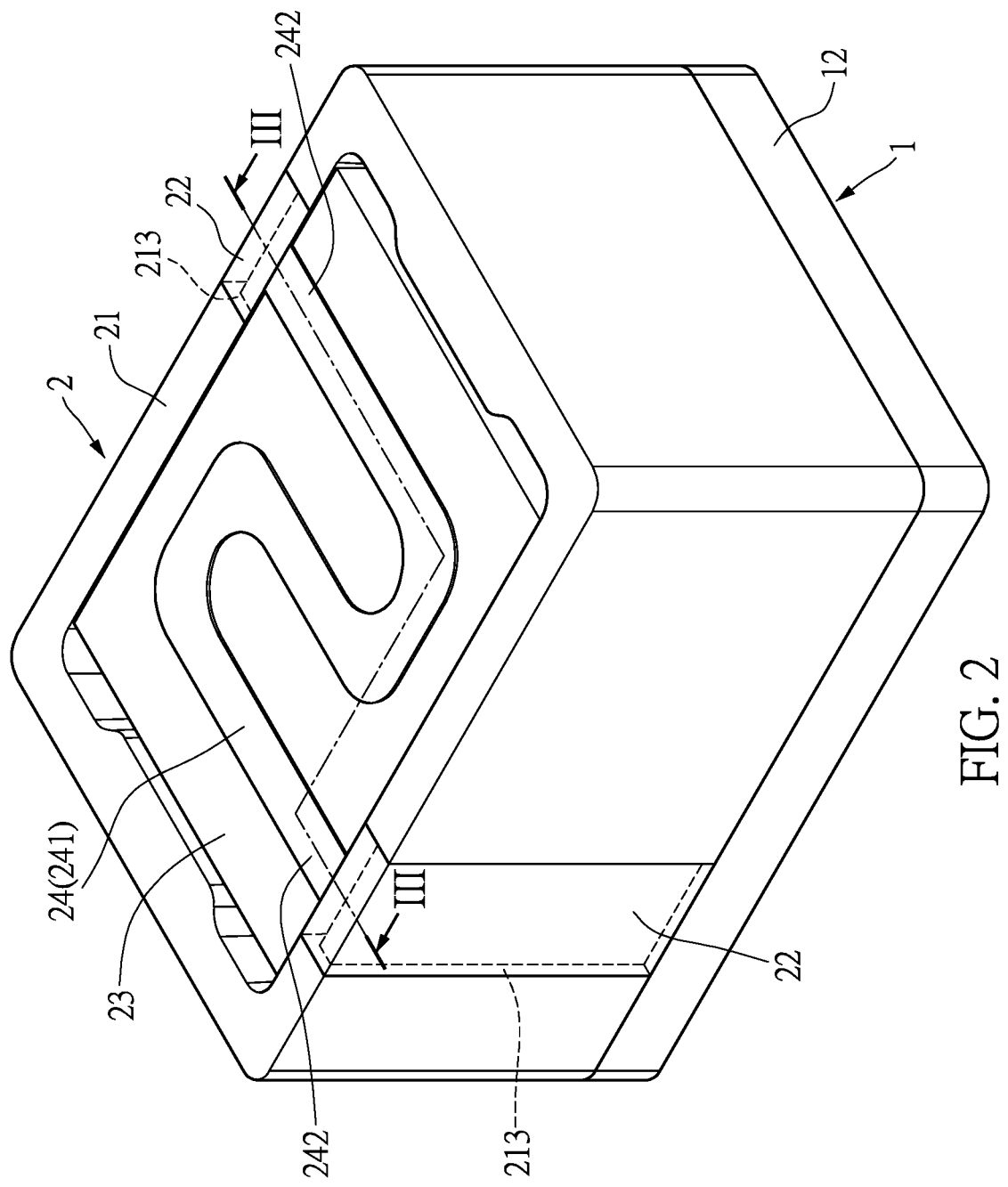
FIG. 2 is a perspective view illustrating a first embodiment of the present disclosure.
Figure 3:
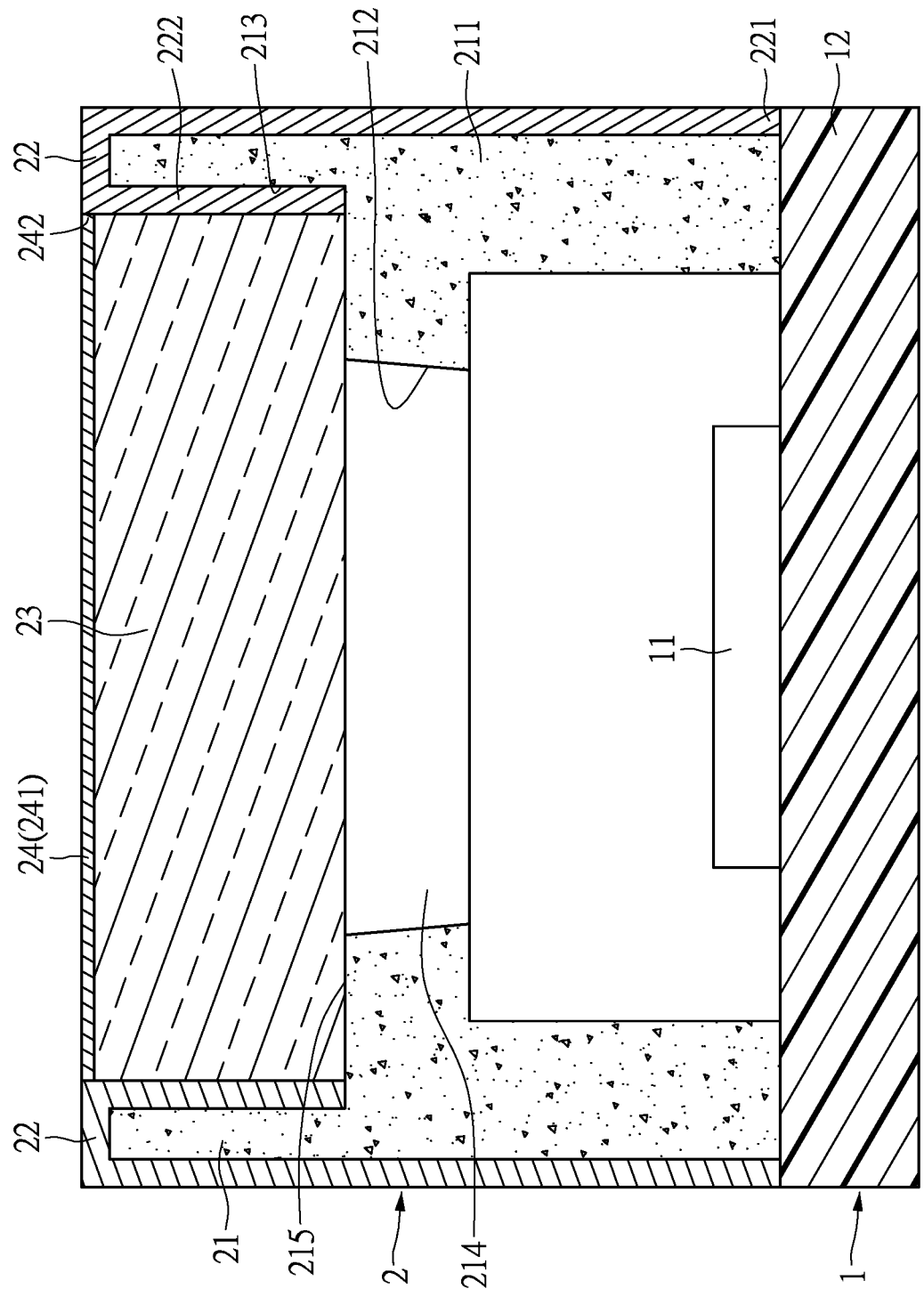
FIG. 3 is a cross-sectional view taken along a line of FIG. 2, illustrating the first embodiment.

Referring to FIG. 2 and FIG. 3, a first embodiment of the present disclosure provides an optical module, including an electronic assembly 1 and an optical assembly 2.

The electronic assembly 1 includes a chip component 11 and a circuit board 12. The chip component 11 is disposed on the circuit board 12 and is driven by a driving circuit (not shown) in the circuit board 12. The chip component 11 is selected from a light-emitting chip or an optical sensor chip, but is not limited thereto. The light-emitting chip can be exemplified as a light-emitting diode (LED), a resonant-cavity light-emitting diode (RCLED), or a vertical-cavity surface-emitting laser chip (VCSEL), but is not limited thereto. The optical sensor chip can be a visible light sensing chip or a non-visible light sensing chip, and can be exemplified but not limited as a CCD chip or a CMOS chip. The chip being applied can be selected according to particular implementations and is not limited by the present disclosure.

The electronic assembly 1 can be installed with a detecting circuit (not shown). The detecting circuit can be integrated in the chip component 11, be disposed inside the circuit board 12, or be the driving circuit itself which drives chip component 11. The configuration of the detecting circuit can be adjusted according to particular implementations, and is not restricted hereto.

The optical assembly 2 is disposed on the electronic assembly 1, and includes a bracket 21 and an optical component 23. The bracket 21 includes a surrounding wall 211, a flange 212, and two grooves 213. The shape of the surrounding wall 211 is substantially a cubic cylinder that surrounds the circuit board 12, and surroundingly defines a channel 214. The shape of the surrounding wall 211 can be adjusted according to particular implementations and is not limited to a cubic cylinder, and can also be a cylinder, a polygonal cylinder, or the like. The flange 212 is in the channel 214 and disposed on the surrounding wall 211, and defines an accommodating region 215 at the top of the channel 214. The grooves 213 are recessed from the surface of the surrounding wall 211, and are disposed at different sides of the surrounding wall 211, respectively. Each groove 213 extends upward from the outside bottom of the surrounding wall 211, passing the top of the surrounding wall 211, and extending inward and downward to the flange 212.

The bracket 21 further includes two separated conductive layers 22. A bottom end 221 of each conductive layer 22 is aligned with the bottom of the bracket 21 and is electrically connected to the circuit board 12. Each conductive layer 22 includes a connecting end 222 for touching the optical component 23. The conductive layers 22 are configured on one of the outer surface, the inner surface, and interior of the bracket 21. The position of the conductive layers 22 depends on particular implementations, and is not limited thereto. When the conductive layers 22 are disposed on the outer surface or the inner surface of the bracket 21, the conductive layers 22 can be formed on the bracket 21 by electroless plating or can be directly adhered to the metal sheets, but is not limited thereto. The connecting end 222 may extend to the top of the surrounding wall 211, and point toward and contact with the optical component 23; otherwise, the connecting end 222 may extend to the inner surface of the surrounding wall 211 to be in contact with the optical component 23. In the first embodiment, the connecting end 222 is exemplified as extending to the inner surface of the surrounding wall 211.

It is worth mentioning that the conductive layers 22 can be formed, according to particular implementations, inside the groove 213 or outside the groove 213. The arrangement of each conductive layer 22 may be, according to particular implementations, the same or different. In the first embodiment, the conductive layers 22 are exemplified as being disposed inside the grooves 213, respectively.

Figure 4:
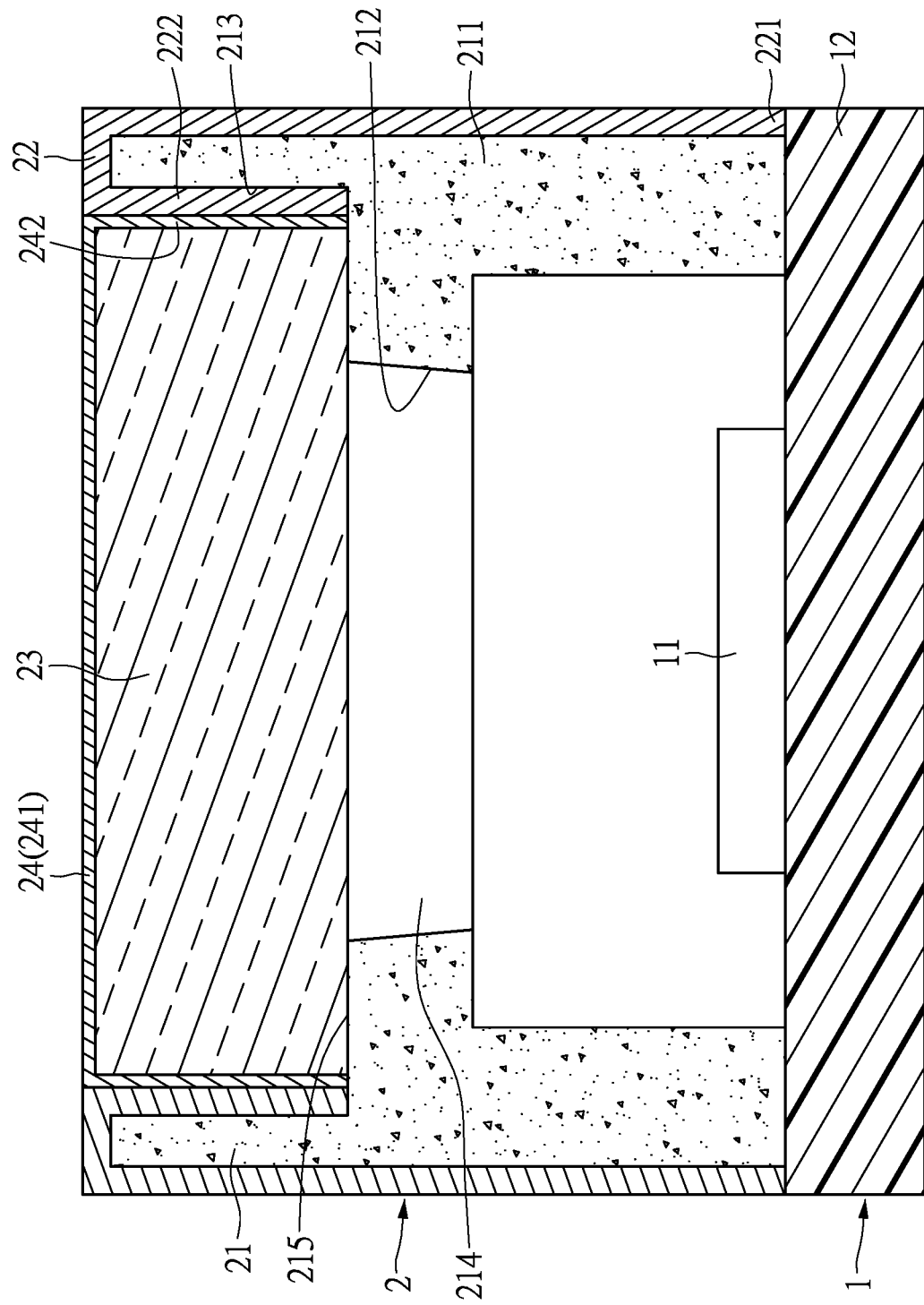
FIG. 4 is a cross-sectional view illustrating another configuration of the first embodiment.

Referring to FIG. 2 and FIG. 4, the optical component 23 is disposed inside the accommodating region 215 of the bracket 21, and includes an optical component body and a light-transmissive conductive layer 24. The shape of the optical component body complements that of the accommodating region 215, so that the shape of the optical component body is rectangular in the first embodiment. The optical component body has a lower surface facing the chip component 11 and an upper surface facing the outside. The optical component body is selected from, but not limited to, a lens, a prism, or a filter. The lens may be exemplified as a planar lens, a condensing lens and an astigmatic lens, but is not limited thereto. The prism may be exemplified as a dispersion prism, a reflecting prism, and a polarizing prism, but is not limited thereto. The filter may be exemplified as a circular polarizer (CPL), a neutral density filter (ND filter), and a UV filter, but is not limited thereto. The material of the optical component body is transparent plastic or glass. The transparent plastic can be selected from polymethylmethacrylate (PMMA), polycarbonate (PC), polyetherimide (PEI), cyclo olefin copolymer (COC), or their mixture. For ease of explanation, a planar lens made of glass is taken as an example for the first embodiment.

Figure 5:
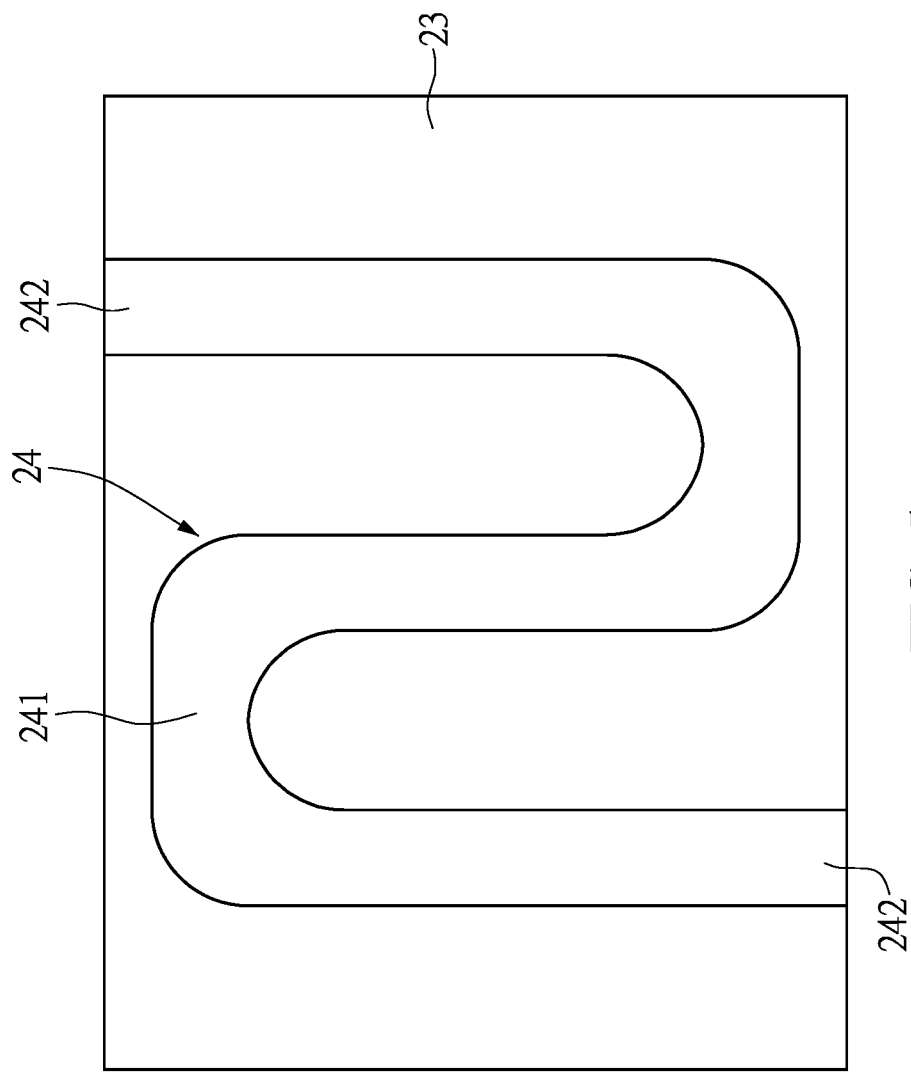
FIG. 5 is a top view illustrating an optical component of the first embodiment.
Figure 6:
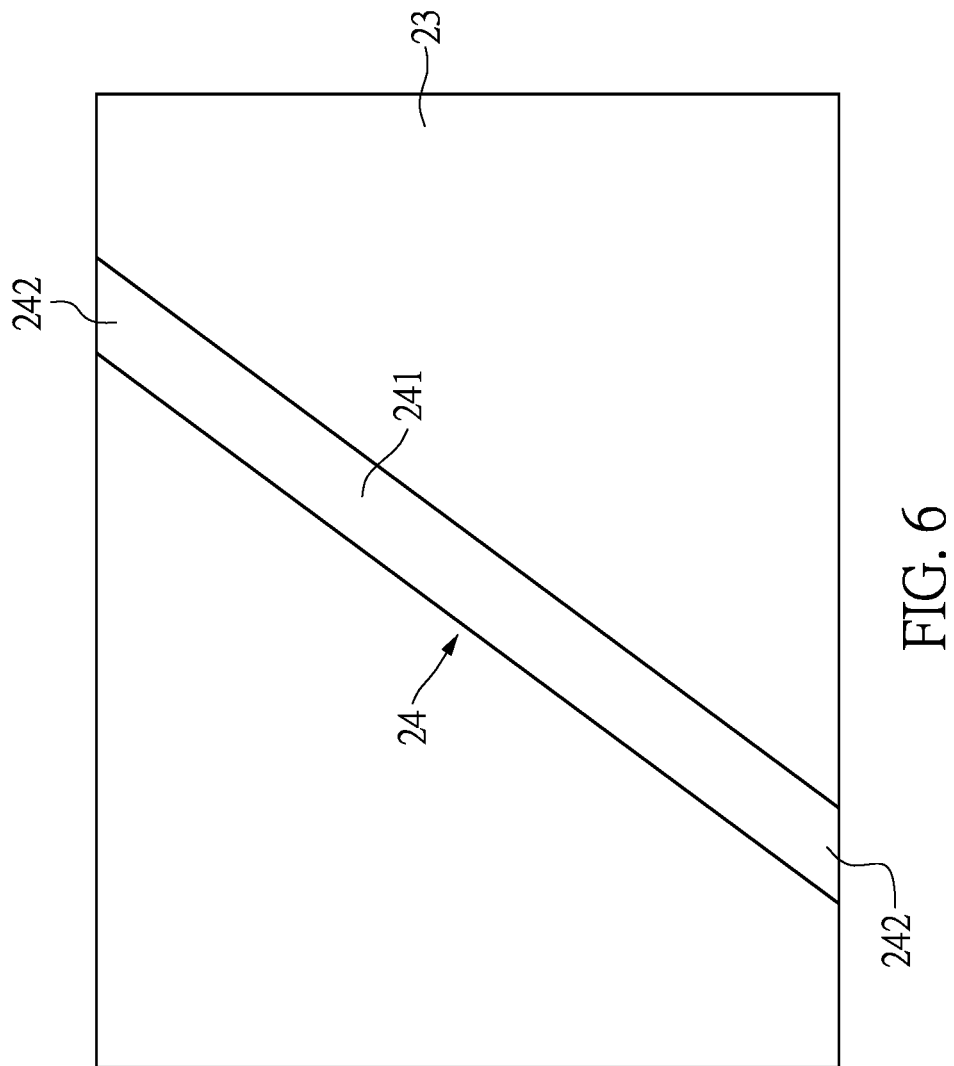
FIG. 6 is a top view illustrating another configuration of the optical component of the first embodiment.

The light-transmissive conductive layer 24 extends from one corner of the optical component body to another opposite corner thereof. The light-transmissive conductive layer 24 includes a main segment 241 and two conductive ends 242. The main segment 241 is disposed on the upper surface or the lower surface of the optical component body. In the first embodiment, the main segment 241 is exemplified as being disposed on the upper surface. The main segment 241 can be in the shape of an S (shown as FIG. 5) or be strip-shaped (shown as FIG. 6). In the first embodiment, an S shape is adopted as an example, but is not limited thereto. The conductive ends 242 are electrically connected to the conductive layers 22, respectively. The conductive ends 242 can be disposed on the same surface as the main segment 241 (shown as FIG. 3), or on a lateral side of the optical component body. The configuration of the conductive ends 242 is not limited by the present disclosure, as long as the conductive ends 242 can be electrically connected to the connecting end 222 of the conductive layer 22. In the first embodiment, the conductive ends 242 are exemplified as being disposed on the upper surface of the optical component body. The width of the light-transmissive conductive layer 24 can be longer, shorter, or equal to the width of the conductive layer 24, and is not limited by the present disclosure. In the first embodiment, the width of the light-transmissive conductive layer 24 is exemplified as being shorter than the width of the conductive layer.

The light-transmissive conductive layer 24 is made of a material with light transmission and conductivity, and the material is selected from, but not limited to, metal, indium tin oxide doped tin ($In_2O_3$:Sn, ITO), tin dioxide doped fluorine ($SnO_2$:F, FTO), tin dioxide doped yttrium ($SnO_2$:Sb, ATO), or zinc oxide doped aluminum (ZnO: Al, AZO). When metal is adopted as the material of the light-transmissive conductive layer 24, the thickness must be less than 10 nm, and it can be exemplified as gold, silver, platinum, copper, aluminum, chromium, palladium or rhodium, but is not limited thereto. In the first embodiment, ITO is taken as an example.

When the optical component 23 is disposed inside the accommodating region 215 of the bracket 21, the conductive ends 242 of the light-transmissive conductive layer 24 are connected to the connecting ends 222 of the conductive layers 22, respectively, that is, the conductive ends 242 are electrically connected to the detecting circuit through the conductive layers 22 to form a protection circuit. By detecting the resistance or current of the protection circuit through the detecting circuit, it can be determined whether the conductive layers 22 are electrically connected to the light-transmissive conductive layer 24. Therefore, when the optical component 23 is loosened and detached from the bracket 21, the light-transmissive conductive layer 24 would also be detached from the conductive layer 22, and the protection circuit would be opened. At this time, the detecting circuit detects the open state of the protection circuit, and then shuts down the driving circuit to stop the operation of the chip component 11, so that the chip component 11 can be prevented from being damaged. Alternatively, when the driving circuit of the chip component 11 is used as the detecting circuit, the driving circuit can also be shut down by connecting the protection circuit and the drive circuit in series to stop the operation of the chip component 11 when the light-transmissive conductive layer 24 is detached from the conductive layer 22.

From the above description, the advantages of the first embodiment can be further summarized as follows:

A. The circuit of the electronic assembly 1 can detect whether the optical component 23 is detached from the bracket 21 through the conductive layers 22 disposed on the bracket 21, and can perform corresponding protection measures.

B. The circuit of the electronic assembly 1 can detect whether the optical component 23 is detached through detecting whether the light-transmissive conductive layer 24 is electrically conducted to the conductive layers 22, and can perform corresponding protection measures.

C. Through configuring the light-transmissive conductive layer 24 on the upper surface of the optical component body, the worn condition of the optical component 23 can be detected. Any object scraping against the upper surface of the optical component body would scrape the light-transmissive conductive layer 24 at the same time; therefore, the light-transmissive conductive layer 24 may be scraped off when the optical component 23 suffers from excessive scraping, which causes the protection circuit to be opened and in turn stops the operation of the chip component 11.

D. An S shape is adopted as the shape of the light-transmissive conductive layer 24 to ensure full coverage of the light-transmissive conductive layer 24 on the optical component body, such as corners, sides, center, and so on. Therefore, this configuration can further ensure that any object scraping the optical element body would also scrape the light-transmitting conductive layer 24 at the same time, thereby improving the ability of detecting the worn condition of the optical component 23.

E. By disposing the conductive layers 22 inside the grooves 213, the conductive layers 22 can be prevented from being damaged by scraping, which would lead to a stop in the operation of the chip component 11. In other words, by disposing the conductive layers 22 inside the grooves 213, it can be ensured that the protection circuit being opened is caused by the optical component 23 detaching from the bracket 21, or the light-transmissive conductive layer 24 being damaged.

F. The conductive ends 242 of the light-transmissive conductive layer 24 extending to the lateral side of the optical component body can increase the contact area with the conductive layer 22, and can ensure an effective electrical connection therebetween. Therefore, only when the optical component 23 is almost or completely detached from the bracket 21 will the light-transmissive conductive layer 24 not be in contact with the conductive layers 23 so that the protection circuit becomes opened. Accordingly, this configuration can prevent misjudgment of the detecting circuit due to any mismatch from shaking between the conductive layers 22 and the light-transmissive conductive layer 24.

G. Since the width of the conductive layer 22 is larger than that of the light-transmissive conductive layer 24, the conductive layer 22 and the light-transmissive conductive layer 24 can be electrically connected with each other even when production error is factored in.

Second Embodiment

Figure 7:
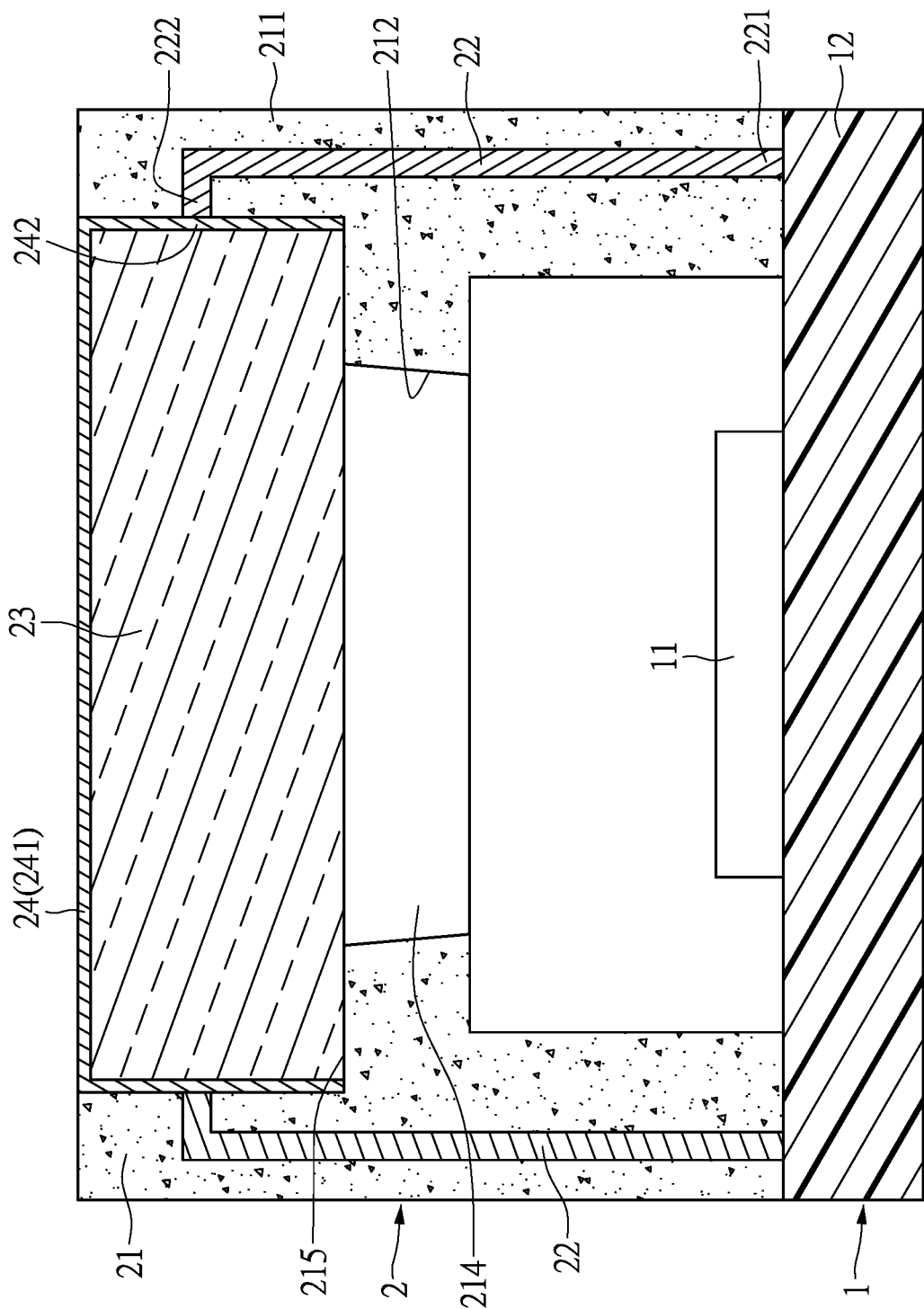
FIG. 7 is a cross-sectional view illustrating a second embodiment of the present disclosure.

Referring to FIG. 7, a second embodiment of the present disclosure is approximately the same as the first embodiment, but a main difference between the present embodiment and the first embodiment is that the conductive ends 242 of the light-transmissive conductive layer 24 extend to the lateral side of the optical components body, and the conductive layer 22 is disposed inside the bracket 21. Since the conductive layer 22 is disposed inside the bracket 21, the bracket 21 does not include the grooves 213 (shown at FIG. 2) in the second embodiment.

The method by which the conductive layers 22 are disposed inside the bracket 21 can be adjusted based on the material and the process of the bracket 21. When the bracket 21 is made of thermoplastic material, the method may be: putting the conductive layers 22 in a mold for making the bracket 21, and then injecting the thermoplastic material into the mold and wrapping the conductive layers 22; finally, curing the thermoplastic material to form the bracket 21. When the bracket 21 is made of ceramic, the method may be: inserting the conductive layers 22 into a blank, and then sintering them together so that the conductive layers 22 are buried in the bracket 21. However, the method can be adjusted according to any conventional method and is not limited thereto.

The structure of the conductive layers 22 buried in the bracket 21 can prevent the conductive layers 22 from damage by scraping, and can further ensure that the protection circuit is opened is due to the optical component 23 detaching from the bracket 21 or the light-transmissive conductive layer 24 being damaged, and not due to the conductive layers 22 themselves being damaged.

Therefore, the second embodiment has the same advantages as the first embodiment, and by burying the conductive layers 22 in the bracket 21, this structure can further ensure the accuracy of detecting whether the optical component 23 is detached from the bracket 21 or suffering from excessive scraping.

Third Embodiment

Figure 8:
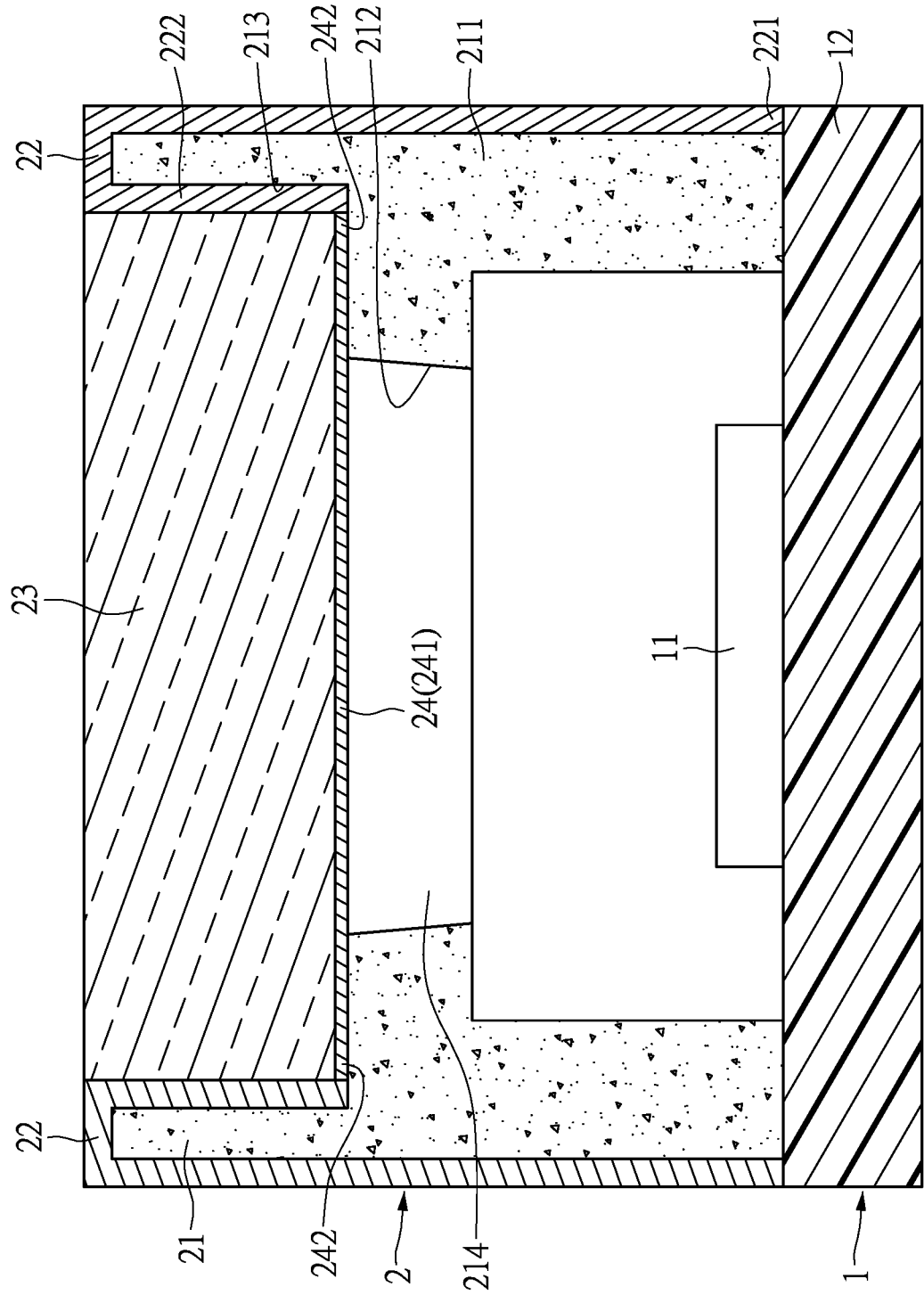
FIG. 8 is a cross-sectional view illustrating a third embodiment of the present disclosure.

Referring to FIG. 8, a third embodiment of the present disclosure is approximately the same as the first embodiment, but a main difference between the present embodiment and the first embodiment is that the light-transmissive conductive layer 24 is disposed on the lower surface of the optical component body. Since the connecting ends 222 of the conductive layers 22 are extended near the lower surface of the optical component body, the connecting ends 222 can be electronically connected to the light-transmissive conductive layer 24.

Figure 9:
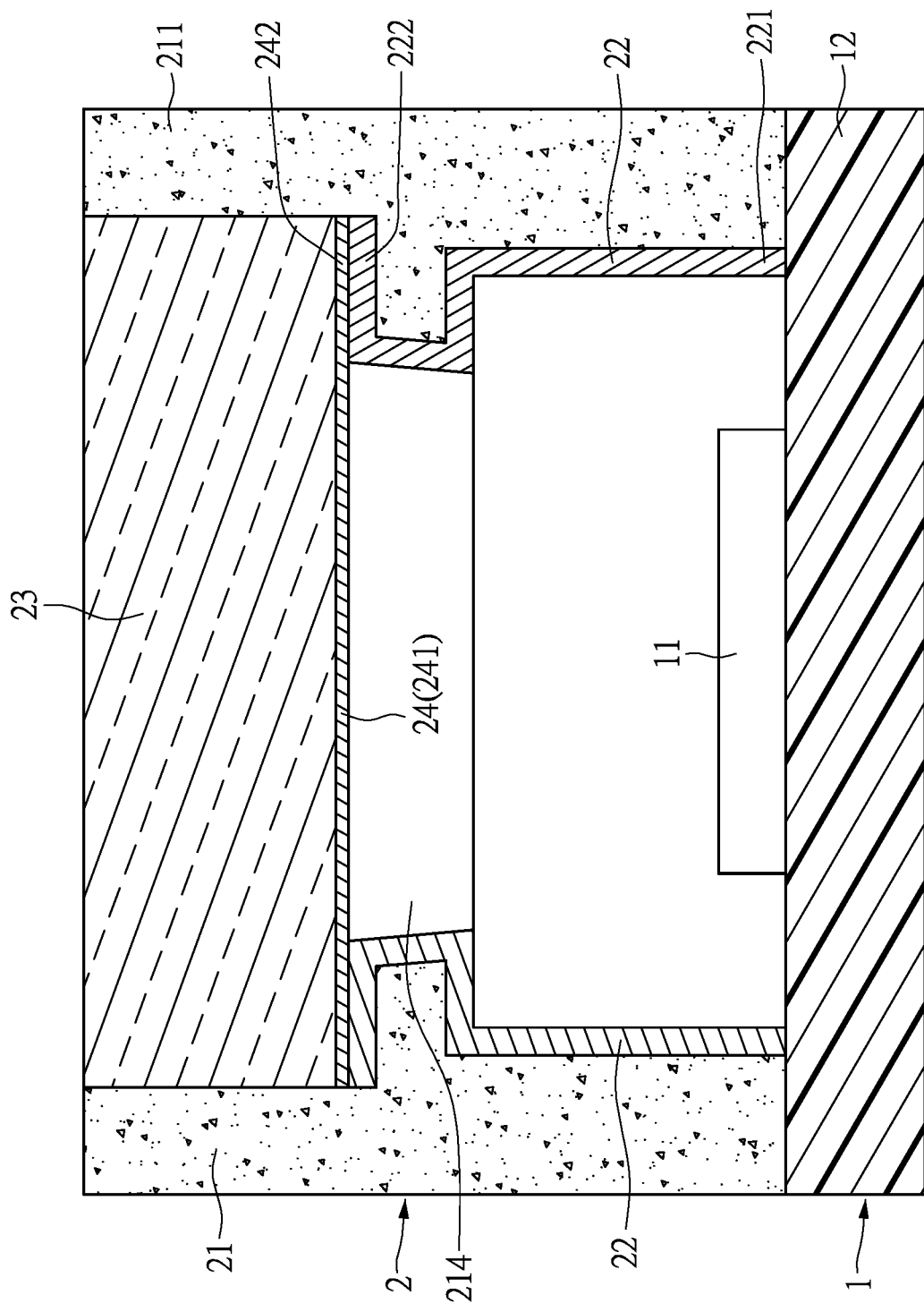
FIG. 9 is a cross-sectional view illustrating another variation of the third embodiment of the present disclosure.

Referring to FIG. 9, in another configuration of the third embodiment, the conductive layers 22 are disposed on the inner surface of the bracket 21. The bottom ends 221 are electrically connected to the circuit board, and the connecting ends 222 extend to the upper side of the flange 212 of the bracket 21. Through this configuration, the light-transmissive conductive layer 24 and the conductive layers 22 can be bonded and electrically connected with each other.

Therefore, the third embodiment has the same advantages as the first embodiment, except that the worn condition of the optical component 23 cannot be detected. Manufacturers can choose any configuration mentioned above according to particular implementations. When the optical module need not have the function of detecting the worn condition of the optical component 23, the present embodiment may be applied. Accordingly, the third embodiment provides another technical solution that allows the manufacturer to make adjustments according to particular implementations.

Fourth Embodiment

Figure 10:
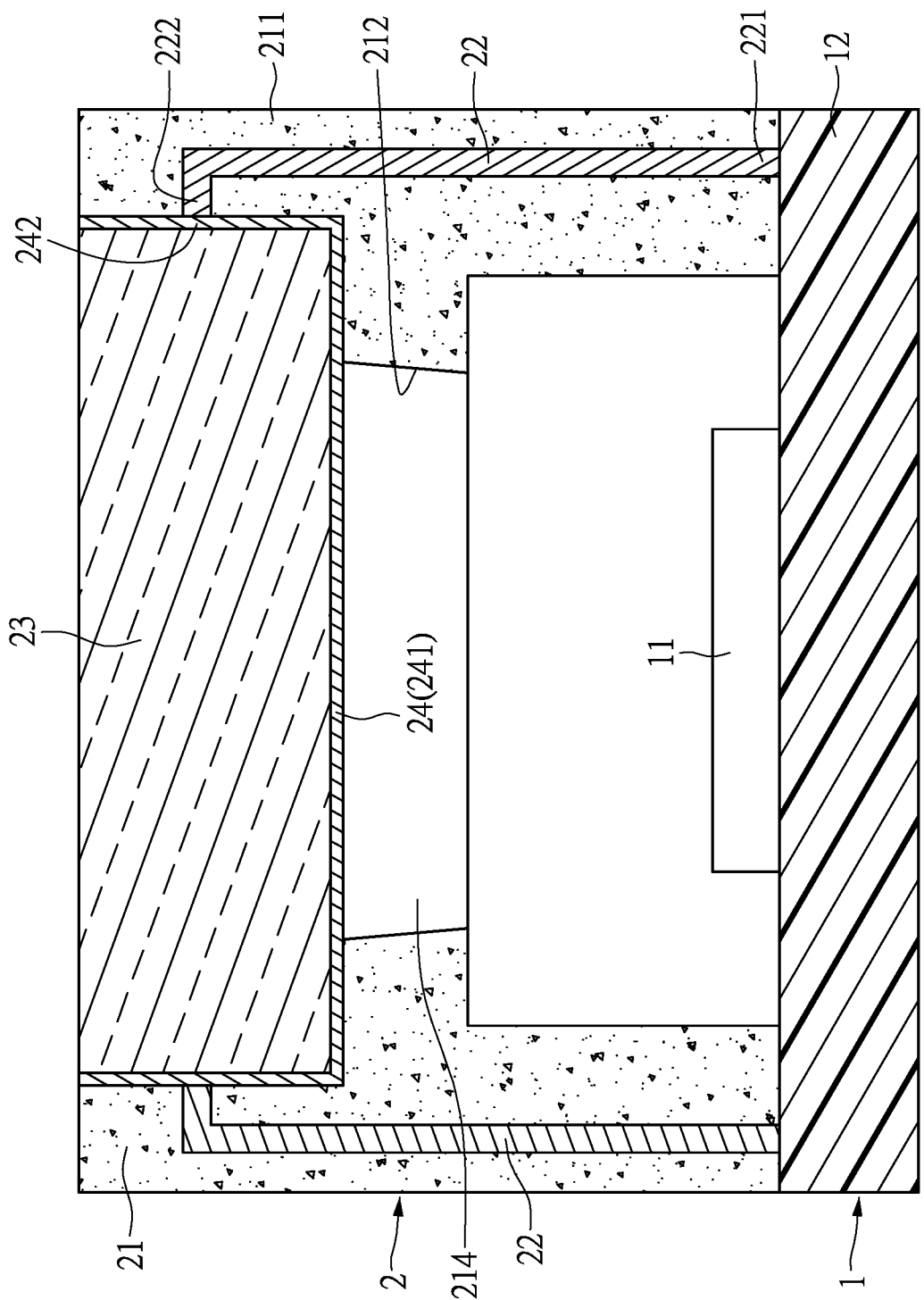
FIG. 10 is a cross-sectional view illustrating a fourth embodiment of the present disclosure

Referring to FIG. 10, a fourth embodiment of the present disclosure is approximately the same as the third embodiment, but a main difference between the present embodiment and the third embodiment is that the conductive ends 242 of the light-transmissive conductive layer 24 extend to the lateral side of the optical component body, and the conductive layers 22 are disposed inside the bracket 21. The configuration of the conductive layers 22 is the same as the second embodiment, and hence is not described herein.

Therefore, the fourth embodiment has the same advantages as the third embodiment. Through burying the conductive layers 22 in the bracket 21, this structure can further ensure the accuracy of detecting whether the optical component 23 is detached from the bracket 21 or whether the optical component 23 is suffering from excessive scraping.

In conclusion, the conductive layers 22 disposed on the bracket 21 can allow the circuit of circuit board 12 to detect whether the optical component 23 is detached from the bracket 21, and perform corresponding protection measures.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical module, comprising:
   an electronic assembly including a chip component and a circuit board; and
   an optical assembly disposed on the electronic assembly, including a bracket and an optical component, the bracket surrounding the chip component and including at least two conductive layers separated from each other, the conductive layers extending to the bottom of the bracket and being electrically connected to the electronic assembly, the optical assembly being disposed on the bracket and including at least one light-transmissive conductive layer which is electrically connected to the conductive layers;
   wherein the optical component further includes an optical component body, the at least one light-transmissive conductive layer is disposed on one of the upper surface and the lower surface of the optical component body, and the at least one light-transmissive conductive layer includes two conductive ends disposed at two sides of the optical component body, respectively; and the conductive layers are configured on one of the outer surface, the inner surface, and the interior of the bracket; wherein the at least one light-transmissive conductive layer is electrically disconnected from the conductive layers when the optical component is detached from the bracket.

2. The optical module according to claim 1, wherein the bracket further includes at least two grooves, and each of the conductive layers is respectively disposed in each of the grooves; the optical component further includes an optical component body on which the at least one light-transmissive conductive layer is disposed, the shape of the optical component body is rectangular, and the at least one light-transmissive conductive layer extends from one corner of the optical component body to another opposite corner thereof; and the at least one light-transmissive conductive layer is S-shaped or strip-shaped.

3. The optical module according to claim 1, wherein the width of the conductive layers is longer than the width of the light-transmissive conductive layer.

4. An optical module, comprising:
   an electronic assembly including a chip component and a circuit board; and
   an optical assembly disposed on the electronic assembly, including a bracket and an optical component, the bracket surrounding the chip component and including at least two conductive layers separated from each other, the conductive layers extending to the bottom of the bracket and being electrically connected to the electronic assembly, the optical assembly being disposed on the bracket and including at least one light-transmissive conductive layer which is electrically connected to the conductive layers;
   wherein the bracket further includes at least two grooves, and each of the conductive layers is respectively disposed in each of the grooves; the optical component further includes an optical component body on which the at least one light-transmissive conductive layer is disposed, the shape of the optical component body is rectangular, and the at least one light-transmissive conductive layer extends from one corner of the optical component body to another opposite corner thereof; and the at least one light-transmissive conductive layer is S-shaped or strip-shaped.

* * * * *